(12) United States Patent
Ortloff

(10) Patent No.: US 7,908,581 B2
(45) Date of Patent: Mar. 15, 2011

(54) INFORMATION MANAGEMENT AND TRACKING SYSTEM (IMTS)

(75) Inventor: Dirk Reinhard Ortloff, Hagen (DE)

(73) Assignee: Process Relations GmbH

( * ) Notice: Subject to any disclaimer, the term of this patent is extended or adjusted under 35 U.S.C. 154(b) by 1178 days.

(21) Appl. No.: 11/526,103

(22) Filed: Sep. 25, 2006

(65) Prior Publication Data

US 2007/0089086 A1 Apr. 19, 2007

Related U.S. Application Data

(63) Continuation of application No. PCT/GB2005/001175, filed on Mar. 24, 2005.

(30) Foreign Application Priority Data

Mar. 24, 2004 (GB) .................................. 0406663.5

(51) Int. Cl.
*G06F 9/44* (2006.01)
*G06F 19/00* (2006.01)

(52) U.S. Cl. ................. 717/100; 716/4; 716/5; 700/121

(58) Field of Classification Search .................. 700/108, 700/96, 111, 97; 716/4, 11, 19
See application file for complete search history.

(56) References Cited

U.S. PATENT DOCUMENTS

| 5,450,326 A | 9/1995 | Black |
| 5,598,341 A | 1/1997 | Ling et al. |
| 5,761,064 A | 6/1998 | La et al. |
| 6,314,379 B1 | 11/2001 | Hu et al. |
| 6,684,121 B1 * | 1/2004 | Lu et al. ......................... 700/108 |
| 7,174,230 B2 * | 2/2007 | Arackaparambil et al. .... 700/96 |
| 2002/0120417 A1 | 8/2002 | Naya et al. |

OTHER PUBLICATIONS

Wong et al., "A virtual factory-based environment for semiconductor device developmnet," 1992, ISMSS 1992., IEEE/SEMI International, p. 117-123.*
Anderson et al., "A common space processing development environment," 1998, Aerospace Confierence, 1998. Proceedings, IEEE, p. 435-446 vol. 2.*

* cited by examiner

*Primary Examiner* — Wei Y Zhen
*Assistant Examiner* — Chung Cheng
(74) *Attorney, Agent, or Firm* — Edell, Shapiro & Finnan, LLC

(57) ABSTRACT

An information management and tracking system manages and tracks artifact data relating to the development of a process, the artifact data including data relating to development experiment parameters, results and products. The system includes a data management component and a process design environment for retaining data relating to the process design. A development tracking environment retains data relating to the process development, including the artifacts. A back annotation environment receives process data and provides it to the development tracking environment. The data management component is arranged to control the process design environment, development tracking environment and back annotation environment such that, in use, the data received and stored therein can be accessed in a linked manner such that, in use, a user can obtain data from each environment and view links there between.

14 Claims, 7 Drawing Sheets

INFORMATION MANAGEMENT AND TRACKING SYSTEM (IMTS)

CROSS REFERENCE TO RELATED APPLICATIONS

This application is a continuation of International Application No. PCT/GB2005/001175, filed on Mar. 24, 2005, entitled "Information Management and Tracking System (IMTS)," which claims priority under 35 U.S.C. §119 to Application No. UK0406663.5 filed on Mar. 24, 2004, entitled "Information Management and Tracking System (IMTS)," the entire contents of which are hereby incorporated by reference.

FIELD OF THE INVENTION

The present invention relates to a system for supporting and tracking thin processes such as film based process development with focus on managing the process development activities and tracking them during their progress as well as the development artifacts such as Scanning Electron Microscopy (SEM)/Atomic Force Microscopy (AFM) images; measurement results; characterization data and the like.

BACKGROUND

The present invention provides a system for managing and tracking one or more information entities associated with one or more operations, with the or each entity capable of being cross-referenced with the or each operation so as to augment a network of information that is storable in the system and accessible through corresponding applications.

Today technology information from a process development, such as a CMOS process development derived from simulation, test productions, tests or measurements is usually kept informally and non-systematically on paper, in electronic spread sheets, or merely in the minds of the process engineers and is hence hardly accessible for use in future process development projects or process porting activities. Furthermore development data or development artifacts, e.g., SEM images, test results, run cards etc., are mostly stored in an unstructured, unrelated way resulting in insufficient reproducibility, less knowledge gain, less development control, less statistical data etc. Therefore there is a strong need for the use of structured formal methods and business/development processes to store this data in a way that makes retrieval and reuse of collected data/knowledge possible and easy to manage.

One major source for this unstructured storage of process development artifacts is, that it is difficult, if not impossible, to define a generic categorization that is always valid which could be used to structure the data. Because of this, it is necessary to be able to access this process development data from diverse points of views. To achieve this, a general and flexible measure is required to store the data in such a way allowing these different views to be created easily from a single representation. This invention proposes such a generic storage mechanism.

No current software system takes care of the above mentioned insufficiencies to the full extent. Some parts are addressed by the products such as CoreDB, OperatorDB and Process Flow of PhoenixBV, which take care of the process parameter and flow storage of the performed processing. Other tools like Promis, marketed by Brooks Automation, are more focused on issues related to the management of production lines, like fab monitoring, yield improvements, and are not targeted for process development where a lot of experiments/simulations are required to generate an appropriate process flow for the intended devices. The basic difference between these two areas is that during the development a lot of process step combinations and step parameters settings are tested to adjust the final device properties into the intended area of operation. The production control area is more focused on a smaller amount of different processes with a much lesser degree of freedom in the steps and therefore more emphasis is placed on the statistical evaluation and comparison between intended and actual properties.

The above mentioned, commercially available tools miss features incorporating all kinds of measurements results, e.g., pictures, material composition analysis sheets, development related documentation, cause-and-effect analysis results and so on into the knowledge base. Because of this they miss out a major part of knowledge conservation and knowledge generation because they do not provide the possibility of closing the loop and comparing a real result with predicted result and use the differences to recalibrate the knowledge base.

SUMMARY

The present invention overcomes the above mentioned insufficiencies by introducing artifact management and process parameter and flow tracking. The invention treats all artifacts related to process development work as "documents" storable in files viewable with an associated application. Because often non extendable standard formats are used by the equipment/vendors/users it is hardly possible to extend the used formats to add the meta data required for knowledge storage and retrieval, e.g., tagging artifacts/documents with keywords or status information. The present invention therefore builds a shell/wrapper around this native data providing the possibility to add meta data for knowledge storage, e.g., keywords, status information, associated results, conclusions, etc., in a flexible and user extendable manner. Additionally the invention offers flexible search mechanisms powered by a search engine enabling specifically tailored searches.

A distinguishing feature of the present invention is the ability to tie these artifacts together by relating them to each other and to the detailed captures of the parameter settings for the different process steps and to the complete process flow. Thus, the invention enables the direct viewing of the impact and changes of the parameters as well as the impact of the concrete flow on the results, thereby providing more insight into the cause-and-effect-chain during the process development.

The above and still further features and advantages of the present invention will become apparent upon consideration of the following definitions, descriptions and descriptive figures of specific embodiments thereof. While these descriptions go into specific details of the invention, it should be understood that variations may and do exist and would be apparent to those skilled in the art based on the descriptions herein.

BRIEF DESCRIPTION OF THE DRAWINGS

Examples of the present invention will now be described, only with reference to the accompanying drawings in which.

In the examples of the present invention, an example process of semiconductor wafer fabrication has been used, although it would be appreciated that the present invention can be applied to other processes, such as pharmaceutical development.

To facilitate the understanding of the invention, the term "artifact" refers to any kind of hard development result or reference produced or used during a development project and kept in some sort of file or link. This includes all documentation such as but not limited to reports, text collections, and spreadsheets, produced by a user as well as all kinds of electronically generated documentation of test files, images, and pictures having a variety of formats and usually kept as files. Additionally it could be references to external sources relevant to the development process or a project. The system based on the invention is able to store and track meta-data about these artifacts among other things.

The term "entities" groups together all relevant development dimensions of the application domain used or produced during a research and development process as well as artificial data groups like meta-data about a specific dimension.

DETAILED DESCRIPTION

Figure 1:
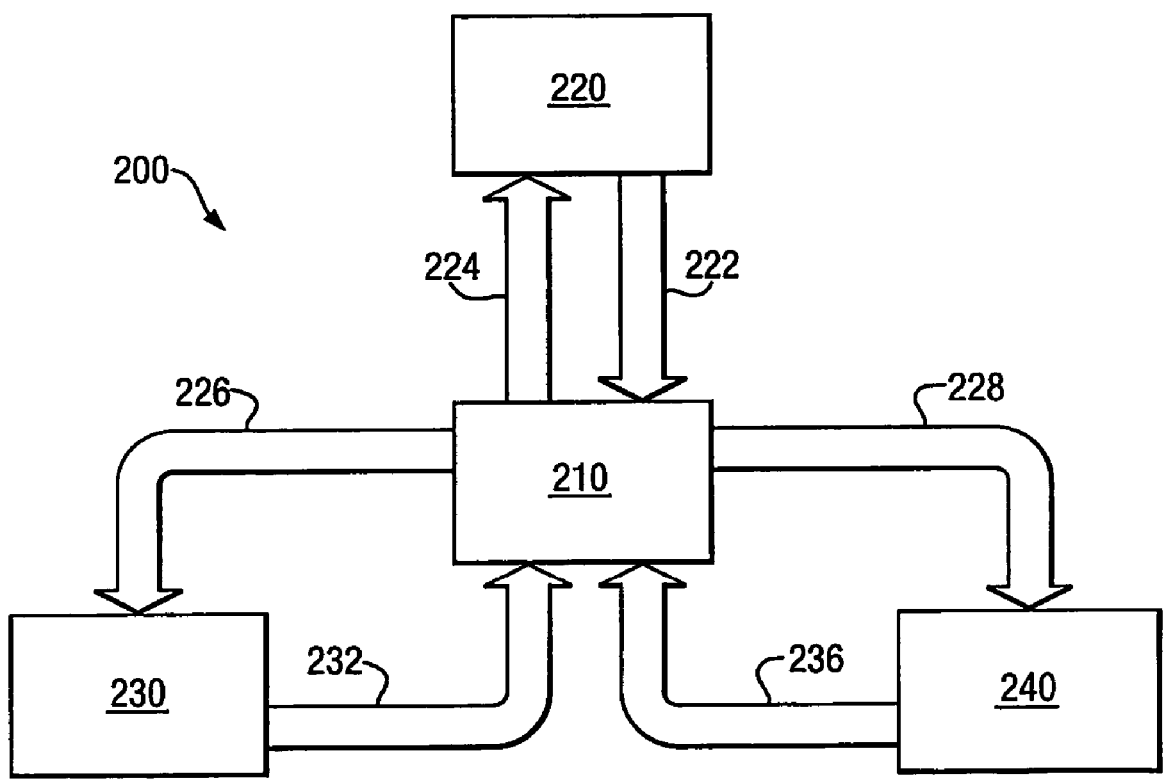
FIG. 1 is a schematic flow diagram showing the general architecture of a process design and tracking environment according to the invention.

FIG. 1 shows a schematic of the general architecture of the process design and tracking environment 200 and its interactions, which represents the interfaces between the different environments, the flow of information between them and the role of the environments in a large system. The system 200 comprises: the process design and development tracking environment 210 representing the core of the system; simulation environment 220 for simulating process steps and flows; the semiconductor fabrication facility environment 230; and the assessment environment 240. As data is input from the step and flow data line 224 to the Simulation environments, the simulation results can flow back to the process design and development tracking environment 210 via simulation result line 222. Here the simulation results can be assessed via the planned inspections line 228 by the assessment environment 240 in which testing or measurement for example may be assessed.

Similarly, details from the fabrication facility environment 230 including actual production control and/or real parameter settings, for example, can flow to the process design and development tracking environment 210 via the real settings flow line 232. Machine setting data 226 can flow to and from the process design and development tracking environment 210 and the semiconductor fabrication facility environment 230. Such an architecture is not limited to a semiconductor process environment but may be equally applied to other technical areas such as active ingredient development for medicine, biological or chemical processes.

Figure 2:
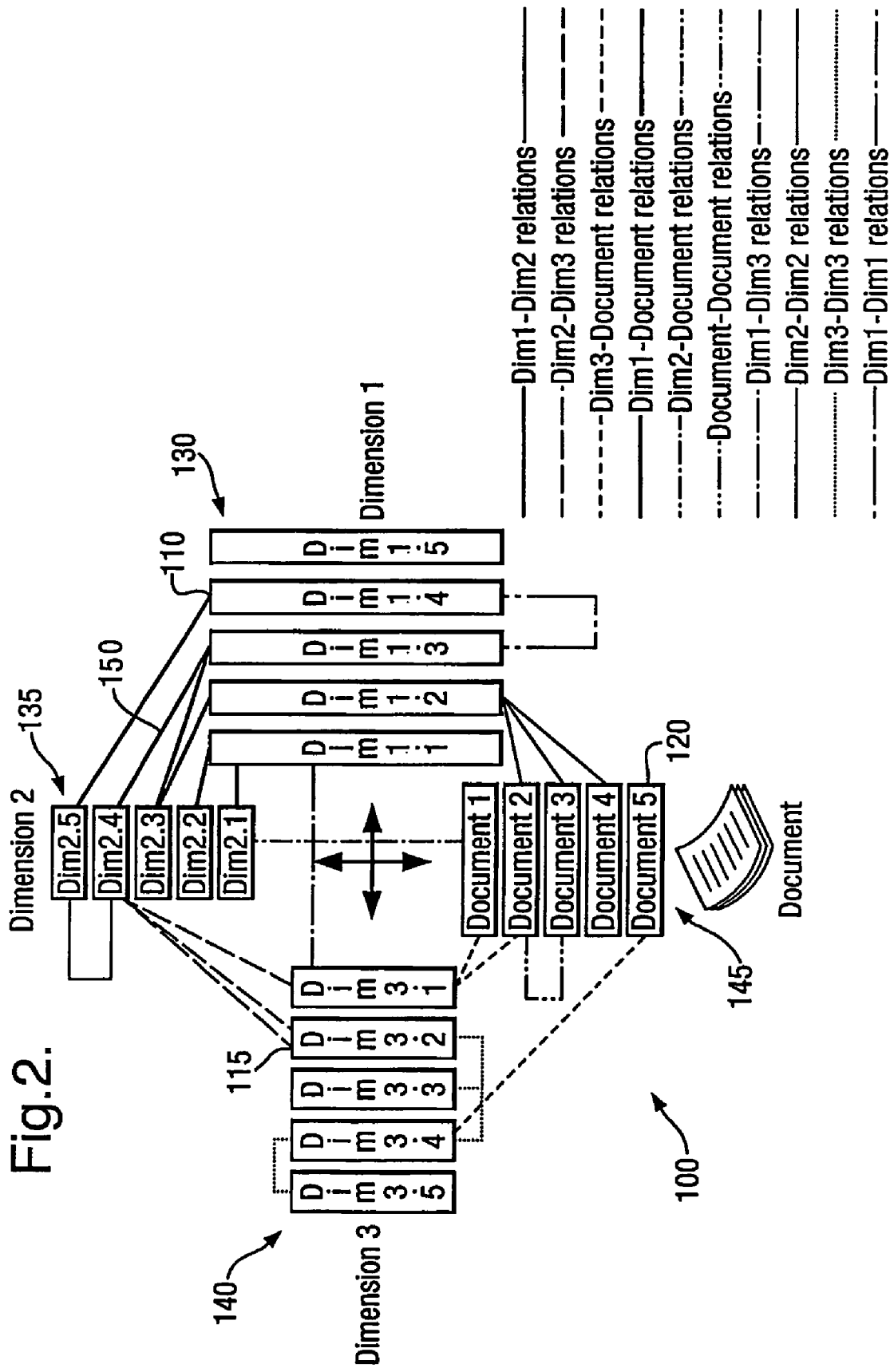
FIGS. 2 and 3 are schematic diagrams showing a general and specific architecture applied in an example of the present invention.

This architecture permits knowledge conservation and knowledge generation to compare real results with predicted results and use the differences to recalibrate the knowledge base, for example the loop 236 back from the "testing" to the process design and development tracking environment 210 as shown in FIG. 2.

FIG. 2 shows the general architecture embodying the invention characterized by the analogy of a spider web 100 comprising a plurality of nodes wherein each node is accessible from another node depending on the distance and the strength of the relation via other nodes. The nodes themselves may be in different dimensions containing information or knowledge relating for example to the development of a product. This enables the incorporation of views from different angles/perspective from a user, who could be a person or may be a system.

Figure 3:
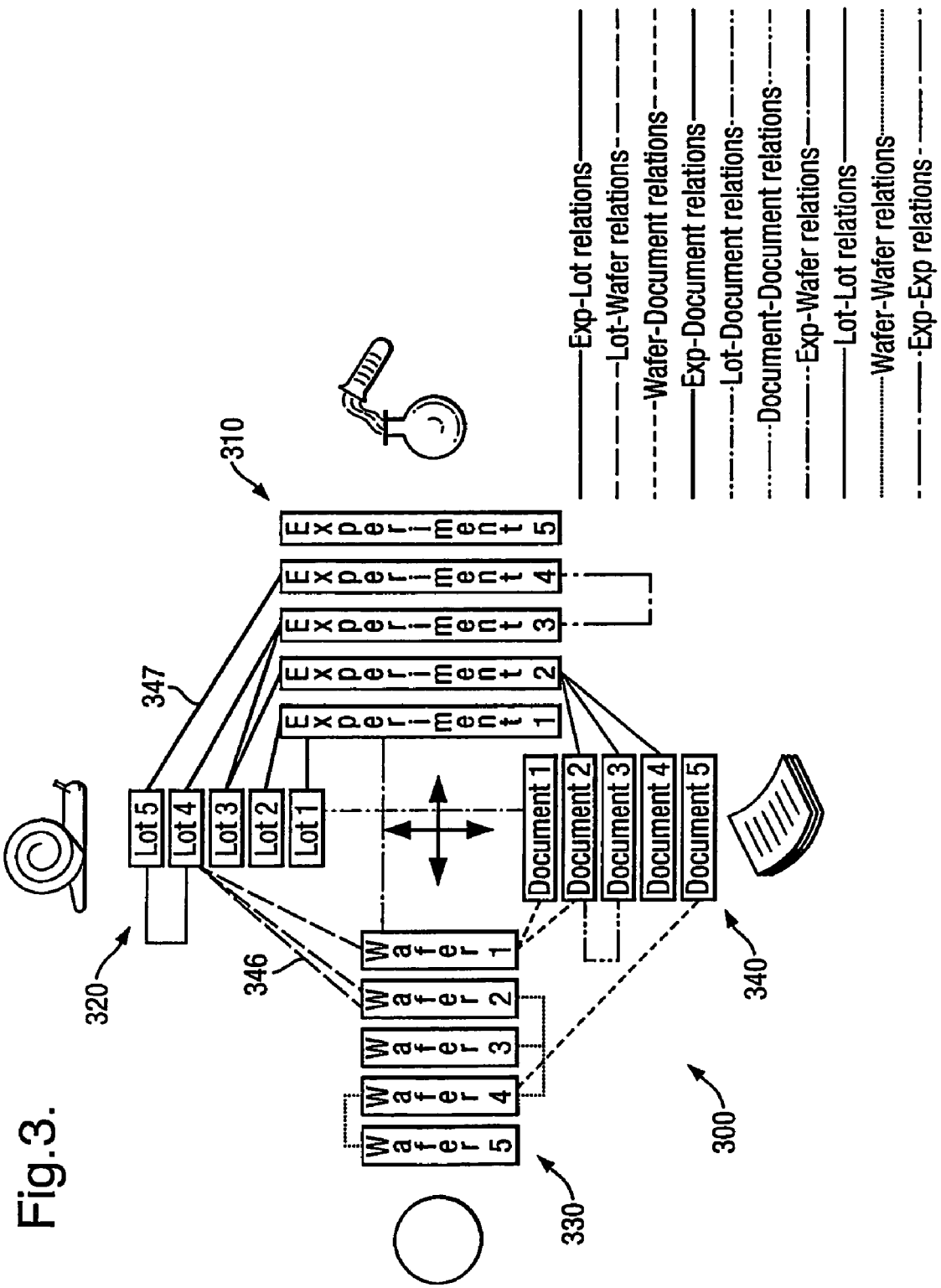

For example, dimension 1 nodes 130 may represent experiments performed on products or samples, dimension 2 nodes 135 may represent a batch of drugs from the pharmaceutical industries, dimension 3 nodes 140 may represent the individual drugs from a particular batch, while the artifact nodes 145, represented here as documents could be images, abstract or the like, contain the artifacts. The different systems based on the invention can capture data about all useful development dimensions, for example in semiconductor process development, such as experiments, lots, wafers and the artifacts are all considered as a document which can be any type of file. All collected dimensions can be related together where every item is relatable to every other, inside and outside the dimension. FIG. 3 shows the source "web" applied to semiconductor processes.

The management system of the invention provides a system having the ability to tie these artifacts together by relating them to each other and especially being able to relate them to the detailed captures of other dimensions of the research and development environment of the application domain. This enables the user to derive and see impacts on experiment parameters and their changes as well as the impacts of the differently executed experiments on the results; thereby it is possible to get more insight into the cause-and-effect-chain of research and development degrees of freedom. In FIG. 2, the different types of correlation and relations that could be made are represented by the lines interfacing the different dimensions, for example, line 150 correlates a node in dimension 2 with a node in dimension 1 and vice versa.

To add information to a system based on the invention quickly with the least amount of effort possible, the system may contain features to automatically populate the artifact database from the file system. For this they should read through a configurable directory structure containing files and directories fulfilling agreed patterns and populate the artifacts and other dimensions from the found files or directories. Additionally relations between corresponding entities should be created to build up the web; in addition, keywords are attached to the created entities.

In a further embodiment of the invention as shown on FIG. 3 a web structure 300 shows an example from the semiconductor industry as to where information is stored in different dimensions of the research and development effort of a product and how correlation can be made to derive useful information regarding its status. In FIG. 3, a first dimension of information is represented by a series of experiments 310, a second dimension represents a series of lots of semiconductor wafers 320, while a third dimension represents individual semiconductors 330 and the artifacts 340 represent documents containing, for example but not limited to, text comments, images and similar information.

Relations can be made by following the different lines interfacing the different dimensions. For example, a user can track the progress of a wafer. It is related to a semiconductor lot via interface line 346. This lot may have undergone certain production steps at the wafer fabrication facility and the information about that will be stored at that node in the dimension.

A turn is interfaced at line 347 and is associated with a particular experiment. This tells the user that certain experiments were undertaken with a particular methodology.

Hence, there information storage and relational features of the invention permits inter-dimensional correlations and intra-dimensional correlations so as to display to the user what information is available about it how they are related to different stages of a processing environment. In this way the user can identify different process steps undertaken at different stages at the manufacturing facility, where the lots or batches were processed and how, what experiments were performed on them, what images for example are stored and can be viewed by the user through the artifacts.

Figure 4:
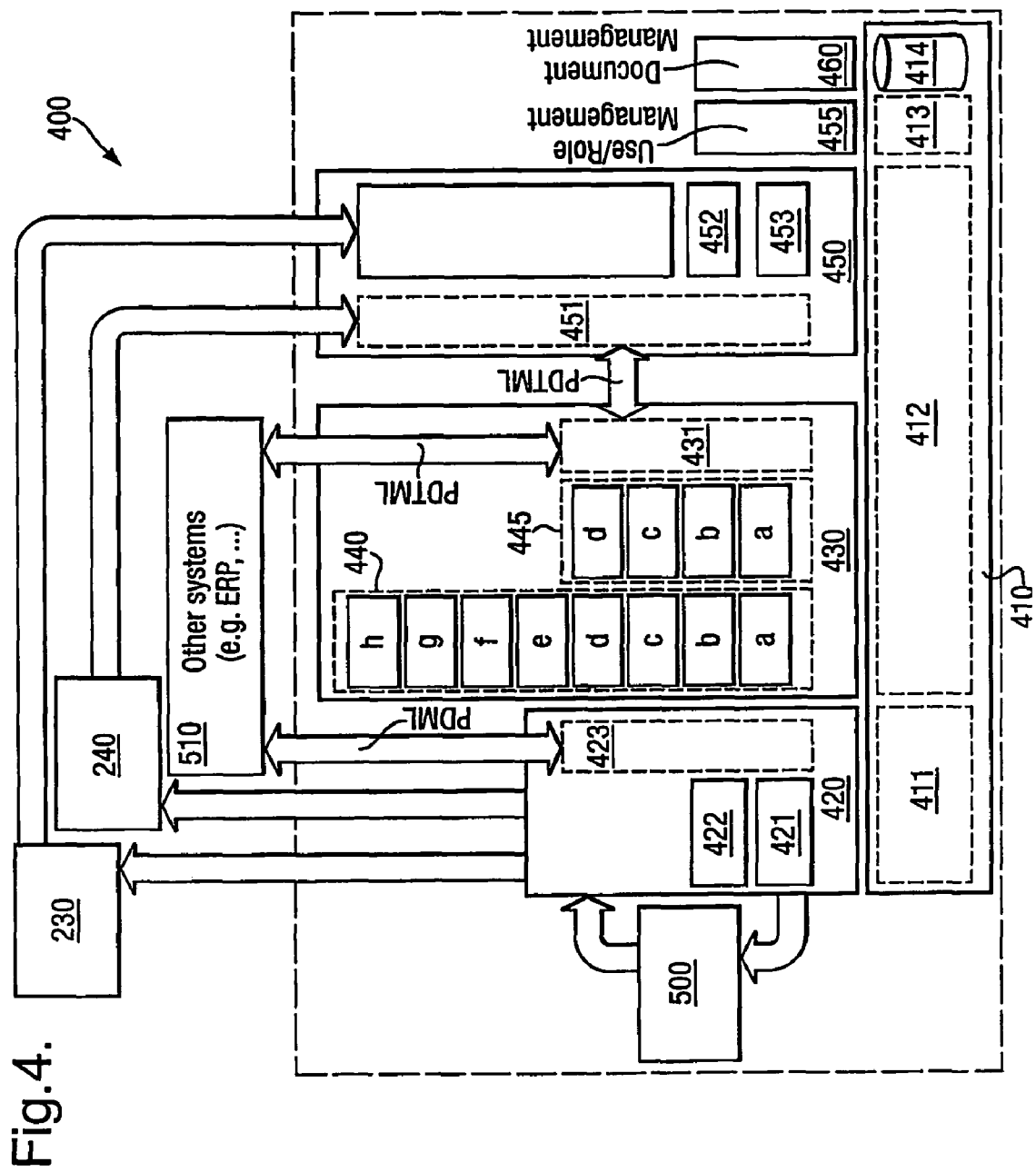
FIG. 4 is a more detailed schematic diagram showing the system of the present invention.

Further to the general concept illustrated in FIG. 1, FIG. 4 which shows the environment and architecture of the information management and tracking system (IMTS) 400 embodying the invention comprising: a data management unit 410 for at least managing data from the design and tracking environment; a process design unit 420 for managing and storing process design information; a process development tracking unit 430; a back annotation unit 450; a use/role management unit 455; and a document management unit 460.

The data management unit 410 further comprises: a design environment data module 411 for handling data for the process design unit 420; a process development tracking data module 412 for handling data for process development tracking environment 430 and the back annotation unit 450; a miscellaneous data module 413 and file data module 414 handle data for the use/role management unit 455 and document management unit 460 respectively.

The process design unit 420 further comprises: a process flow design module 422; a process step design module 421; and an import/export module 423.

The data process development tracking unit 430 further comprises: a data maintenance module 440; a retrieval module 445; and an import/export module 431. The data maintenance module 440 further comprising dimensions, as described hereinbefore, of at least process flow 440a, process step 440b; artifacts 440c; wafer 440d; design 440e; experiment 440g; and a project 440h. The retrieval module 445 is at least capable of: searching 445a, navigation 445b, reporting 445c and statistical assessment 445d.

Referring to FIG. 4, the back annotation unit 450 further comprises: an import/export module 451; a scheduling module 452; and a tracking population module 453.

The process design unit 420 can interact, as required, with a simulation unit 500 to provide data to and receive data from during process development. The process design unit 420 also provides appropriate data via its import/export module 423 to external systems 510 as well as to fabrication and assessment environments 230, 240. Data from the fabrication and assessment environments, 230, 240 is fed back into the system via the back annotation unit 450, which in turn can feed the information, as required, to the process development tracking unit 430.

Figure 5:
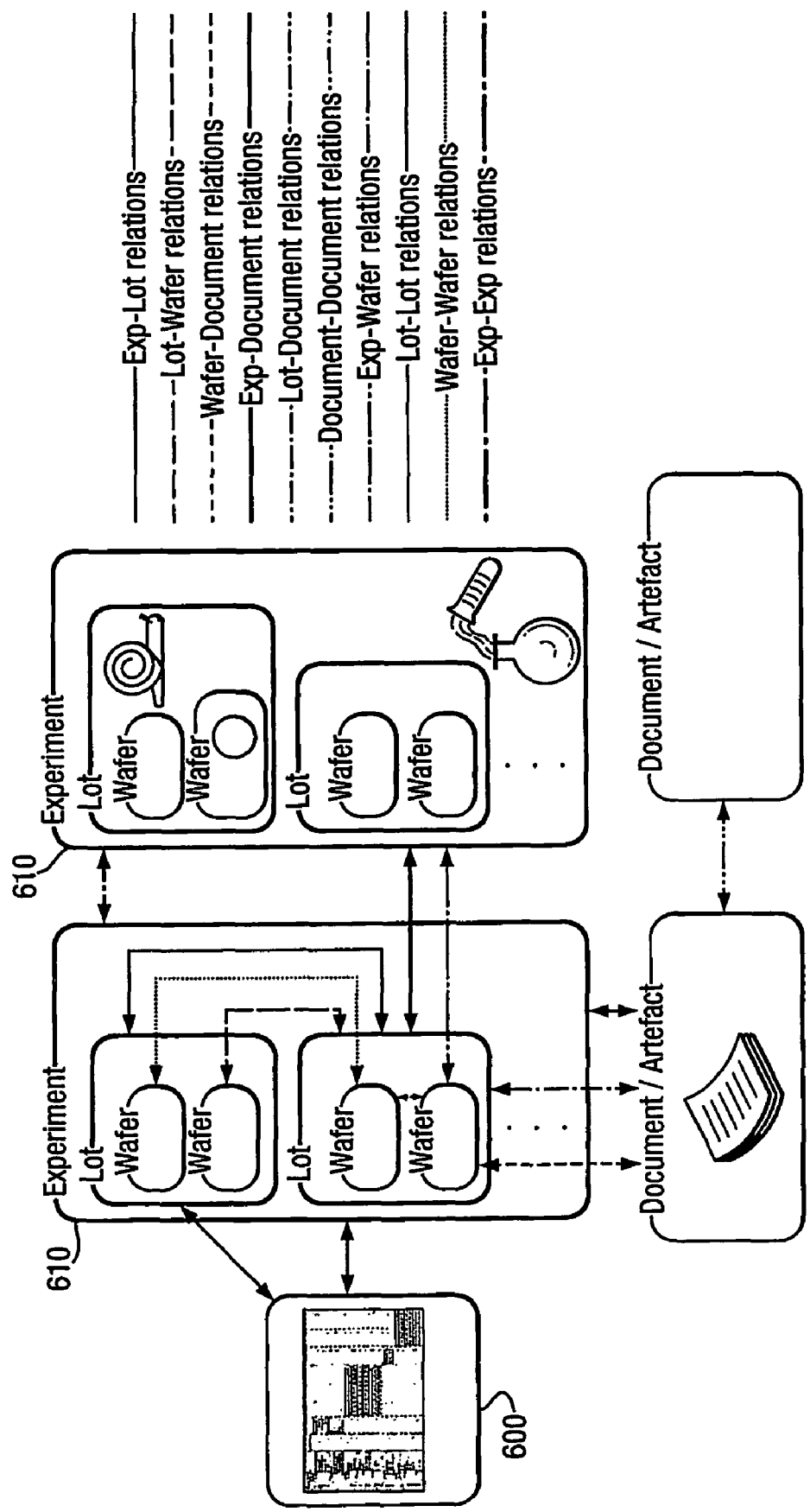
FIG. 5 is a schematic diagram showing data being presented by the system of the present invention to a user.
Figure 6:
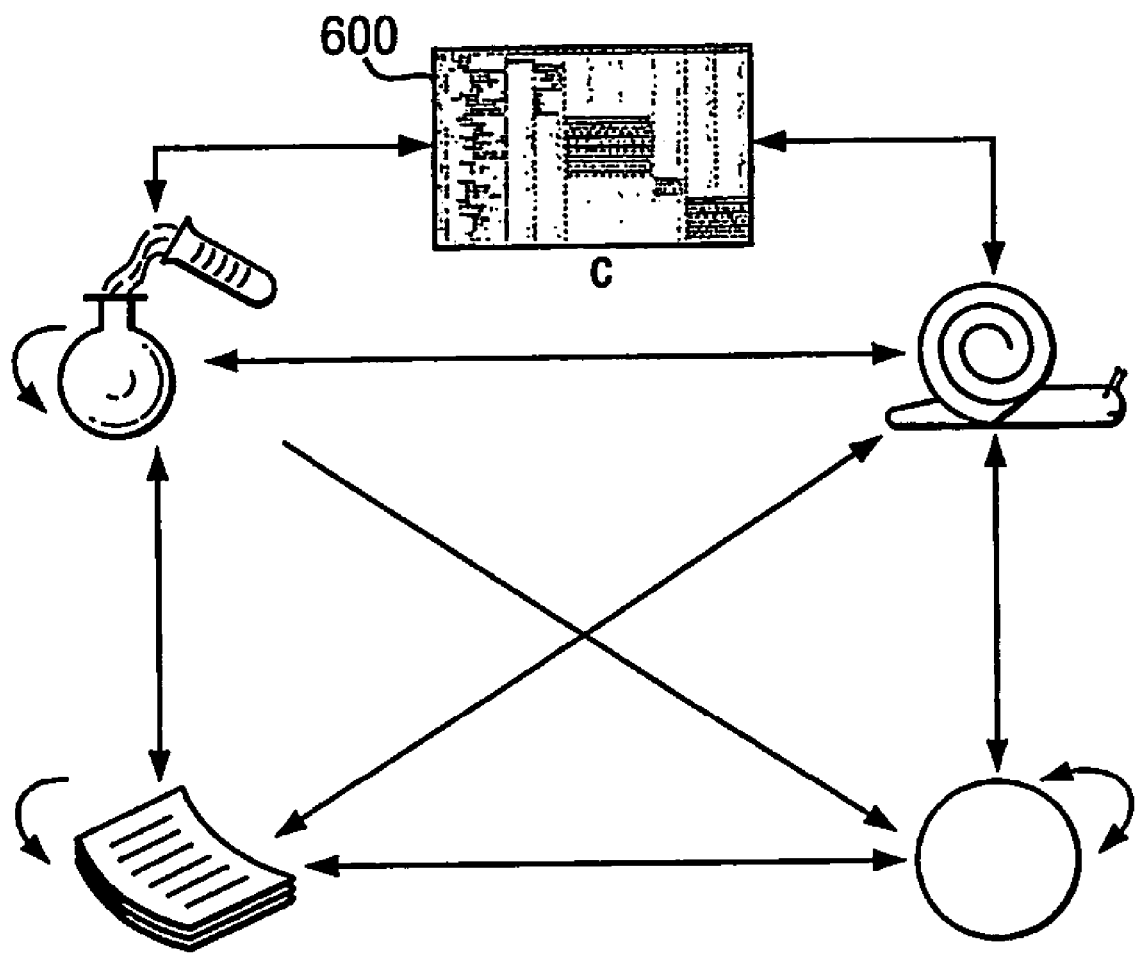
FIG. 6 is a schematic diagram showing user access through the system can follow.

The components of the system are controlled to ensure that data can be presented to the user in a manner of the type shown in FIG. 5. As can be seen from this figure, a project overview display 600 can be provided and within that individual experiment modules 610 can be displayed with data representing, in this example, to particular manufacturing lots, the wafers produced in those lots, as well as any artifacts associated with the particular experiment being drawn in and linked to the particular experiment for ease of understanding of the user. Links can be provided to adjacent experiment where, for example, common wafers or common lots have been employed, so that, again, a user can have an informed overview of the project and understand the links between particular experiments, lots, wafers and artifacts as required. FIG. 6 shows how a user can move through the data from the project screen.

Figure 7:
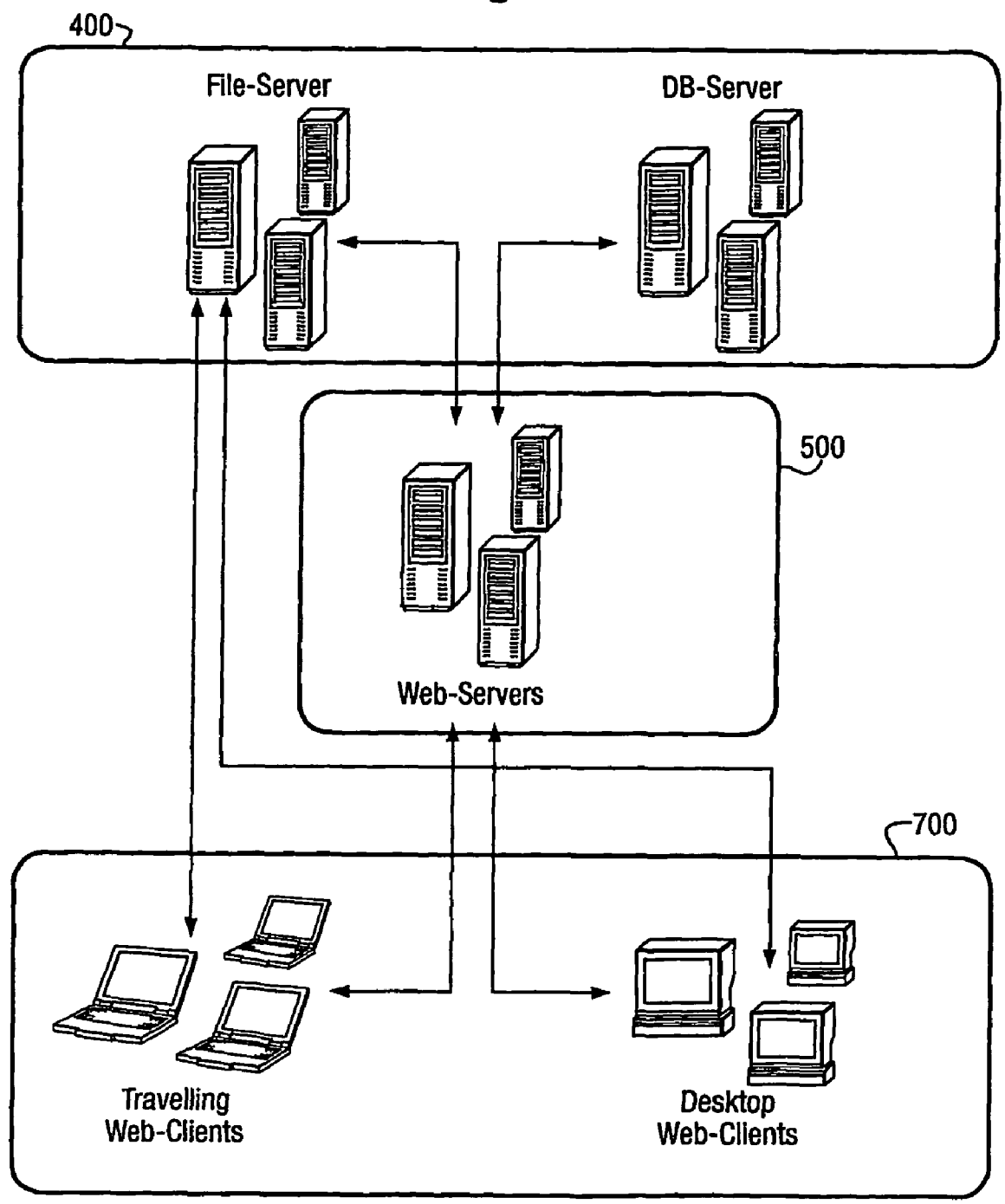
FIG. 7 is a general schematic diagram showing the interaction of a system according to the invention realized over a computer network.

FIG. 7 shows how the system 400 of the present invention can interact, in use, with simulation or application systems 500 to provide and obtain appropriate data as well as with user presentation systems 700 to provide and receive input data from users either remotely, e.g., perhaps through an internet-based system, or at a fixed base.

As will be appreciated from the above, the present invention provides an information management and tracking system which is capable of receiving project data from a number of sources, process and collate that data, and then enable its presentation to a user in a manner which ensures the user can obtain an appropriate overview of the system to manage a development process in a manner not provided previously.

While the invention has been described in detail with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An information management and tracking system for managing and tracking artifact data relating to the development of a process, the system comprising:
    a data management component;
    a process design unit configured to store data relating to a process design;
    a development tracking unit configured to store data relating to a process development, including said artifact data which includes data relating to development experiment parameters, results, and products; and
    a back annotation unit configured to receive process data and to provide the process data to the development tracking unit, wherein:
    the data management component is configured to control the process design unit, the development tracking unit, and back annotation unit such that the data received and stored therein is accessible in a linked manner that allows a user to obtain data from each unit and to view links between units;
    the data management component is further configured to add meta data to the artifact data to enable linked viewing and searching thereof; and
    the system is configured to manage data associated with a semiconductor manufacturing process development.

2. The system according to claim 1, wherein the process design unit is configured to communicate with the annotation unit.

3. The system according to claim 2, wherein the process design unit is configured to provide data to at least one of a fabrication system and an assessment system.

4. The system according to claim 1, wherein the process design unit is configured to provide data to at least one of a fabrication system and an assessment system.

5. The system according to claim 4, the system being configured to manage data associated with a semiconductor manufacturing process development.

6. The system according to claim 1, further comprising:
    a display configured to receive and display data provided thereto by the data management component.

7. The system according to claim 1, wherein:
the data relating to the process design includes data relating to process steps, process flow, and simulation results; and
the stored data is linked such that at least one process design datum relating to at least one of: a process step, a process flow, and a simulation result is linked to an artifact datum relating to at least one of: a development experiment parameter, a result, and a product.

8. The system according to claim 7, wherein the artifact data includes data related to at least one of: pictures, material composition analysis sheets, development related documentation, and cause-and-effect analysis results.

9. A method of managing and tracking information, the information including artifact data relating to development of a process, the method comprising the steps of:
providing a data management component;
retaining data relating to a process design in a process design unit;
retaining process development data in a development tracking unit, the process development data relating to a process development and including the artifact data which includes data relating to development experiment parameters, results, and products;
receiving process data in a back annotation unit and providing the process data to the development tracking unit;
controlling the data management component to control the process design unit, the development tracking unit, and the back annotation unit such that data received and stored therein is accessible in a linked manner that allows a user to obtain data from each unit and to view links between units; and
further controlling the data management component to add meta data to the artifact data to enable linked viewing and searching thereof,
wherein the method manages data associated with a semiconductor manufacturing process development.

10. The method according to claim 9, wherein:
the data relating to the process design includes data relating to process steps, process flow, and simulation results; and
the stored data is linked such that at least one process design datum relating to at least one of: a process step, a process flow, and a simulation result is linked to an artifact datum relating to at least one of: a development experiment parameter, a result, and a product.

11. The method according to claim 10, wherein the artifact data includes data related to at least one of: pictures, material composition analysis sheets, development related documentation, and cause-and-effect analysis results.

12. A computer readable storage unit storing instructions that, when executed by a computer, cause the computer to perform the functions of:
retaining data relating to a process design in a process design unit;
retaining process development data in a development tracking unit, the process development data relating to a process development and including artifact data which includes data relating to development experiment parameters, results, and products;
receiving process data in a back annotation unit and providing the process data to the development tracking unit;
controlling a data management component to control the process design unit, the development tracking unit, and the back annotation unit such that data received and stored therein is accessible in a linked manner that allows a user to obtain data from each unit and to view links between units; and
further controlling the data management component to add meta data to the artifact data to enable linked viewing and searching thereof,
wherein the functions are performed to manage data associated with a semiconductor manufacturing process development.

13. The apparatus according to claim 12, wherein:
the data relating to the process design includes data relating to process steps, process flow, and simulation results; and
the stored data is linked such that at least one process design datum relating to at least one of: a process step, a process flow, and a simulation result is linked to an artifact datum relating to at least one of: a development experiment parameter, a result, and a product.

14. The apparatus according to claim 13, wherein the artifact data includes data related to at least one of: pictures, material composition analysis sheets, development related documentation, and cause-and-effect analysis results.

* * * * *